(12) United States Patent
Kobayashi et al.

(10) Patent No.: US 9,299,739 B2
(45) Date of Patent: Mar. 29, 2016

(54) IMAGE PICKUP APPARATUS AND IMAGE PICKUP SYSTEM

(71) Applicant: CANON KABUSHIKI KAISHA, Tokyo (JP)

(72) Inventors: Masahiro Kobayashi, Tokyo (JP); Takafumi Kishi, Yokohama (JP); Yuichiro Yamashita, Hsinchu (TW)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/735,485

(22) Filed: Jun. 10, 2015

(65) Prior Publication Data
US 2015/0279898 A1 Oct. 1, 2015

Related U.S. Application Data

(63) Continuation of application No. 13/741,792, filed on Jan. 15, 2013, now Pat. No. 9,082,894.

(30) Foreign Application Priority Data

Jan. 18, 2012 (JP) .................................. 2012-008204

(51) Int. Cl.
*H01L 27/146* (2006.01)
*H04N 5/355* (2011.01)
*H01L 31/02* (2006.01)
*H04N 5/369* (2011.01)

(52) U.S. Cl.
CPC ...... *H01L 27/14656* (2013.01); *H01L 27/1461* (2013.01); *H01L 27/1463* (2013.01); *H01L 27/14607* (2013.01); *H01L 27/14627* (2013.01); *H01L 27/14641* (2013.01); *H01L 27/14645* (2013.01); *H01L 27/14654* (2013.01); *H01L 27/14689* (2013.01); *H01L 31/02* (2013.01); *H04N 5/355* (2013.01); *H04N 5/3559* (2013.01); *H04N 5/369* (2013.01)

(58) Field of Classification Search
None
See application file for complete search history.

(56) References Cited

U.S. PATENT DOCUMENTS 7,719,040 B2 * 5/2010 Nagasaki .......... H01L 27/14603 257/292
7,928,477 B2 * 4/2011 Kobayashi ........ H01L 27/14603 257/225

FOREIGN PATENT DOCUMENTS

JP 2002-217396 A 8/2002
JP 2004-335802 A 11/2004
JP 2008-193527 A 8/2008

* cited by examiner

*Primary Examiner* — Ahmed A Berhan
(74) *Attorney, Agent, or Firm* — Canon USA, Inc. IP Division

(57) ABSTRACT

In a photoelectric conversion apparatus that adds signals of a plurality of photoelectric conversion elements included in photoelectric conversion units, each of the plurality of photoelectric conversion elements includes a first semiconductor region of a first conductivity type that collects signal carriers. The first semiconductor regions included in photoelectric conversion elements that are included in each of the photoelectric conversion units and that are arranged adjacent to each other sandwich a second semiconductor region of a second conductivity type. A height of a potential barrier for the signal carriers generated in a certain region of the second semiconductor region is smaller than a height of a potential barrier for the signal carriers generated in a third semiconductor region between each of the first semiconductor regions and an overflow drain region of the first conductivity type.

18 Claims, 12 Drawing Sheets

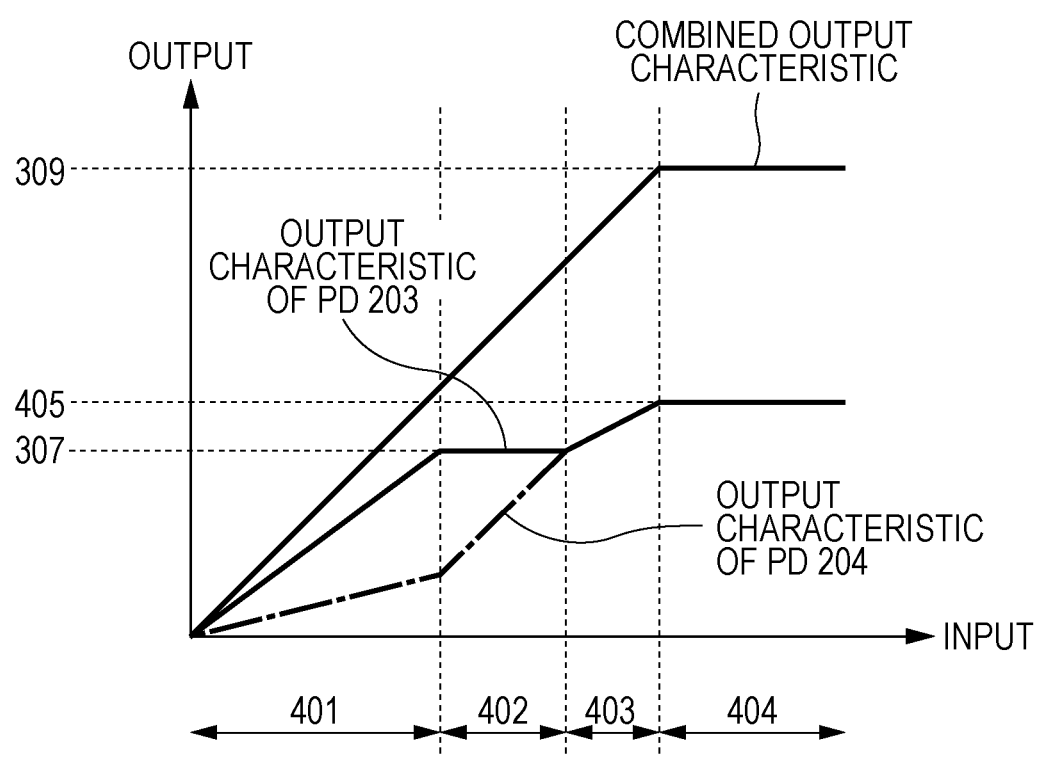

IMAGE PICKUP APPARATUS AND IMAGE PICKUP SYSTEM

CROSS-REFERENCE TO RELATED APPLICATIONS

This application is a continuation, and claims the benefit, of U.S. patent application Ser. No. 13/741,792, presently pending and filed on Jan. 15, 2013, and this application claims the benefit of Japanese Patent Application No. 2012-008204, filed Jan. 18, 2012, which applications are hereby incorporated by reference herein in their entireties.

BACKGROUND OF THE INVENTION

1. Field of the Invention

One disclosed aspect of the embodiments relates to an image pickup apparatus and, more specifically, to isolation structure between photoelectric conversion elements.

2. Description of the Related Art

Currently, in a photoelectric conversion apparatus, there is a case in which signals generated in a plurality of photoelectric conversion elements are processed as a signal of a single pixel. For example, a technology has been disclosed in which focus detection using a phase difference method is performed by focusing light onto a plurality of photoelectric conversion elements using a single microlens. For example, as described in Japanese Patent Laid-Open No. 2001-250931, focus detection is performed by separately reading signals of photoelectric conversion elements corresponding to a single microlens. Thereafter, by adding the signals of the photoelectric conversion elements corresponding to the single microlens, the signals may be treated as a signal of a single pixel.

When signals of a plurality of photoelectric conversion elements are treated as a signal of a single pixel, an appropriate signal might not be obtained if there are differences in sensitivity or the amount of incident light between the plurality of photoelectric conversion elements. Especially because the photoelectric conversion elements are located adjacent to various elements, an appropriate signal might not be obtained depending on isolation structure between the adjacent elements. This is a process that may be performed not only in an application such as phase difference detection but also in various applications, and greater problems may arise as the application field of image pickup apparatuses develops.

The present embodiments provide a desired signal when a single signal is obtained using signals of a plurality of photoelectric conversion elements by making isolation structure between the photoelectric conversion elements and elements adjacent to the photoelectric conversion elements appropriate.

SUMMARY OF THE INVENTION

One of the embodiments is an image pickup apparatus including a plurality of photoelectric conversion units, each including a plurality of photoelectric conversion elements. Signals of the plurality of photoelectric conversion elements included in the plurality of photoelectric conversion units are added. Each of the plurality of photoelectric conversion elements includes a first semiconductor region of a first conductivity type that collects the signal carriers. The first semiconductor regions included in photoelectric conversion elements that are included in each of the photoelectric conversion units and that are arranged adjacent to each other sandwich a second semiconductor region of a second conductivity type. A height of a potential barrier for the signal carriers generated in a certain region of the second semiconductor region is smaller than a height of a potential barrier for the signal carriers generated in a region between each of the first semiconductor regions and an overflow drain region of the first conductivity type.

Further features of the disclosure will become apparent from the following description of exemplary embodiments with reference to the attached drawings.

BRIEF DESCRIPTION OF THE DRAWINGS

FIG. 4 is a diagram schematically illustrating the output of the image pickup apparatus according to the first embodiment.

DESCRIPTION OF THE EMBODIMENTS

One disclosed feature of the embodiments may be described as a process which is usually depicted as a timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

Figure 12A:
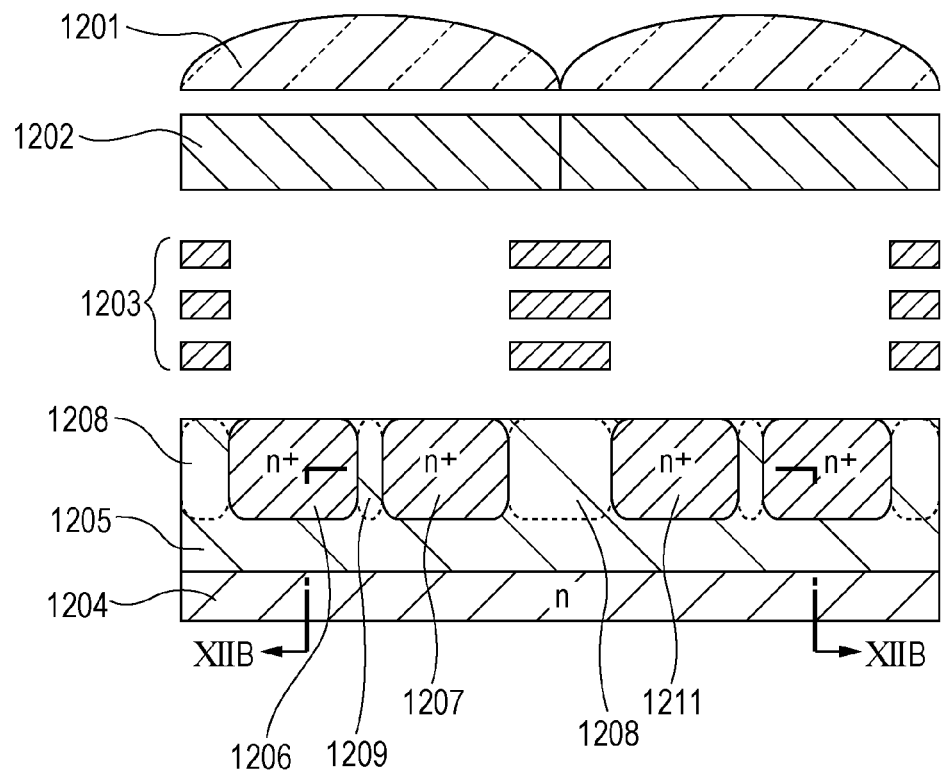
FIGS. 12A and 12B are diagrams schematically illustrating the cross-sectional structure and the minimum potential of pixels in an image pickup apparatus.
Figure 12B:
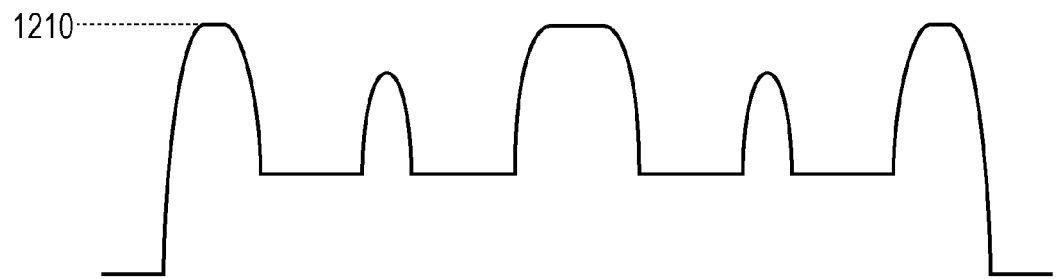

First, FIGS. 12A and 12B illustrate an example to facilitate understanding of the embodiments. FIG. 12A is a diagram illustrating the cross-sectional structure of pixels in an image pickup apparatus, and FIG. 12B in a lower part is a diagram schematically illustrating the potential of a semiconductor layer.

Microlenses 1201 and color filters 1202 are illustrated. Wires 1203 drive transistors in the pixels and supply power supply voltage and a ground potential. A p-type semiconductor region 1205 is provided on an n-type semiconductor substrate 1204. N-type semiconductor regions 1206, 1207, and 1211 are provided in such a way as to configure p-n junctions with the p-type semiconductor region 1205. These regions configure photodiodes (PDs in the following description) that serve as photoelectric conversion elements.

A p-type semiconductor region 1208 is provided between the n-type semiconductor regions 1207 and 1211 of the adjacent pixels that do not share the same microlens 1201 and color filter 1202. Each p-type semiconductor region 1208 may function as a potential barrier for electrons, which are signal carriers, between the n-type semiconductor regions 1207 and 1211.

A p-type semiconductor region 1209 is provided between the n-type semiconductor regions 1206 and 1207 that share the same microlens 1201. Each p-type semiconductor region 1209 may function as a potential barrier for electrons, which are signal carriers, between the n-type semiconductor regions 1206 and 1207. The height of the potential barrier of the p-type semiconductor region 1208 is represented by a height 1210 of the potential barrier illustrated in FIG. 12B.

In the case of such structure, when one of adjacent PDs has been saturated due to a difference in sensitivity or luminance between the PDs, charge generated thereafter may leak. Moreover, charge generated in the saturated PD may leak into the n-type semiconductor substrate 1204. Furthermore, the charge in the PD might leak into a floating diffusion region configured by an n-type semiconductor region that serves as a reading region to which the charge is transferred. Especially because the n-type semiconductor substrate 1204 and the floating diffusion region may function as overflow drain regions (OFD regions) and the OFD regions originally aim to discharge saturated charge, the charge is highly likely to leak into the OFD regions.

Figure 13:
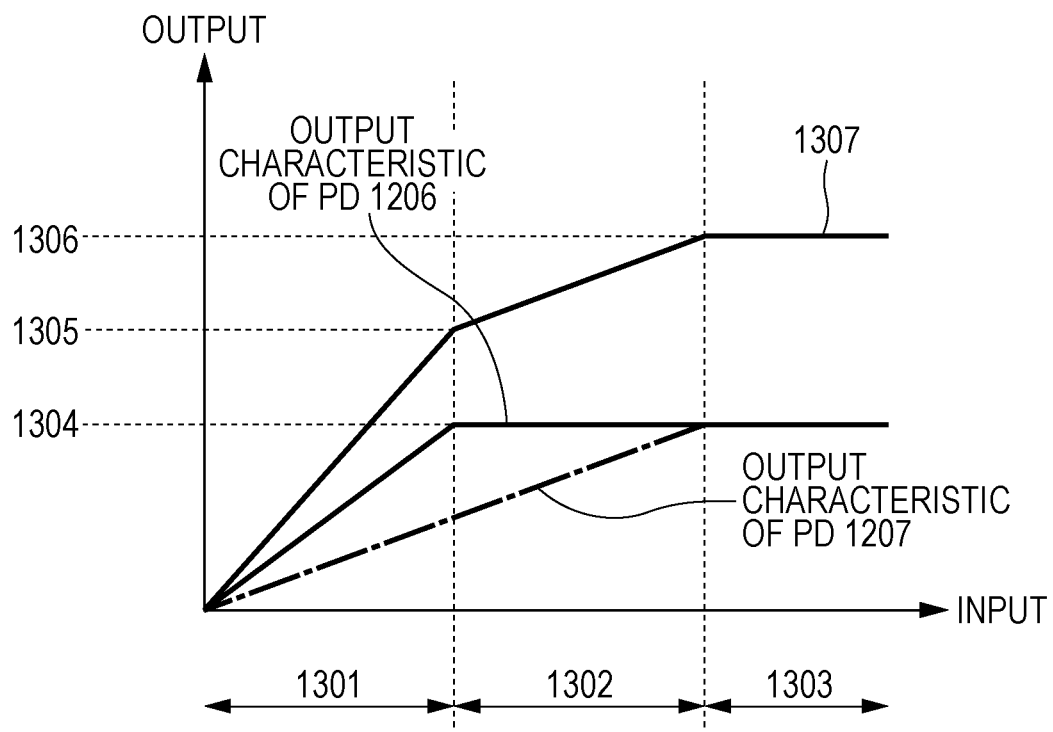
FIG. 13 is a diagram schematically illustrating the output of the image pickup apparatus.

As a result of examinations conducted by the inventors, it has been found out that if a large amount of charge generated after a PD is saturated has leaked into an OFD region, a phenomenon illustrated in FIG. 13 may occur when signals of PDs are added and used for a captured image.

FIG. 13 illustrates a combined input/output characteristic at a time when the input/output characteristics of PDs (hereinafter referred to as a PD 1206 and a PD 1207) corresponding to the two n-type semiconductor regions 1206 and 1207 and the outputs of the PDs 1206 and 1207 are combined. When light is incident on the PDs, photoelectric conversion is performed and electron-hole pairs are generated. For the sake of explanation, FIG. 13 schematically illustrates a situation in which the PD 1206 has higher sensitivity than the PD 1207 or the amount of light incident on the PD 1206 is larger than that incident on the PD 1207. When the amount of light incident on the PDs is within a range 1301 illustrated in FIG. 13, the amount of charge generated is larger in the PD 1206 than in the PD 1207, but since the PD 1206 has not been saturated, an output obtained by combining the signals of the PD 1206 and the PD 1207 is appropriate. However, in the case of a range 1302 illustrated in FIG. 13, the PD 1206 has been saturated, but the PD 1207 has not been saturated. In this case, since the output of the PD 1206 has been saturated, the output of the PD 1206 no longer becomes larger, whereas the PD 1207 has an appropriate output according to the incident light since the PD 1207 has not been saturated. Therefore, a combined output 1307 after the PD 1206 is saturated is determined by a value obtained by combining the outputs of the PD 1206 and the PD 1207, and, as a result, the combined output may have a knee characteristic after the PD 1206 is saturated. This phenomenon is significant when the charge generated after the PD 1206 is saturated is leaking into regions other than the PD 1207, especially into OFD regions provided around the n-type semiconductor regions that configure the PDs.

On the other hand, one of the present embodiments has a characteristic that the height of a potential barrier provided between a plurality of photoelectric conversion elements included in the same photoelectric conversion unit is lower than the height of a potential barrier provided between an n-type semiconductor region and an OFD region of a photoelectric conversion element.

Next, a block diagram of a photoelectric conversion apparatus according to each of the present embodiments will be described. Here, an image pickup apparatus is illustrated as an example of the photoelectric conversion apparatus. The embodiments may be applied to an apparatus other than the image pickup apparatus insofar as the apparatus utilizes photoelectric conversion.

Figure 1:
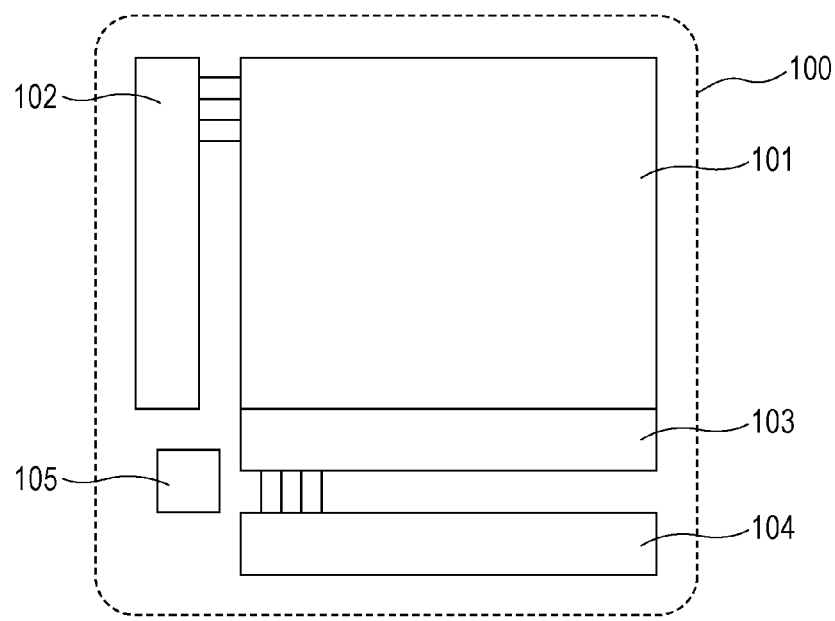
FIG. 1 is a diagram schematically illustrating the overall configuration of an image pickup apparatus according to each of the present embodiments.

FIG. 1 is a diagram illustrating the outline of an image pickup apparatus to which the present embodiments may be applied. In FIG. 1, an image pickup apparatus 100 includes a pixel array 101 and a vertical selection circuit 102 that selects a row in the pixel array 101. In the pixel array 101, a plurality of photoelectric conversion units are provided. The plurality of photoelectric conversion units may be arranged in two dimensions.

The vertical selection circuit 102 selects a certain row, and signals are output from photoelectric conversion units included in the certain row to vertical output lines. A vertical output line may be provided for each column or for a plurality of columns, or a plurality of vertical output lines may be provided for each pixel column. When a plurality of vertical output lines are provided for each pixel column, the speed at which signals are read may be increased.

A column circuit 103 receives signals read to the plurality of vertical output lines parallel to one another. The column circuit 103 may execute at least one of the following processes: amplification of the signals; analog-to-digital conversion; and noise reduction.

A horizontal selection circuit 104 sequentially, randomly, or simultaneously selects the signals held by the column circuit 103 and outputs the signals to a horizontal output line, which is not illustrated.

A serial interface 105 communicates with the outside in order to, for example, determine an operation mode from the outside. It is to be noted that the image pickup apparatus 100 may include, in addition to the illustrated components, for example, a timing generator, a control circuit, or the like that provides timing pulses for the vertical selection circuit 102, the horizontal selection circuit 104, and the column circuit 103.

The block diagram of FIG. 1 may be applied to all the following embodiments. In addition, the terms "vertical" and "horizontal" are used for the sake of convenience and therefore may be switched.

Figure 14A:
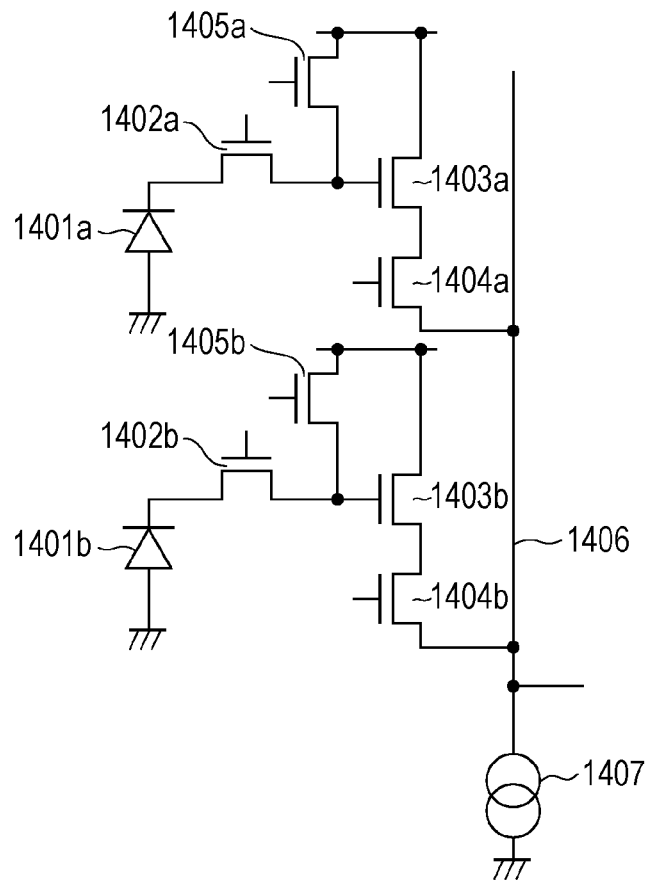
FIGS. 14A and 14B are diagrams illustrating examples of the equivalent circuit of a photoelectric conversion unit.
Figure 14B:
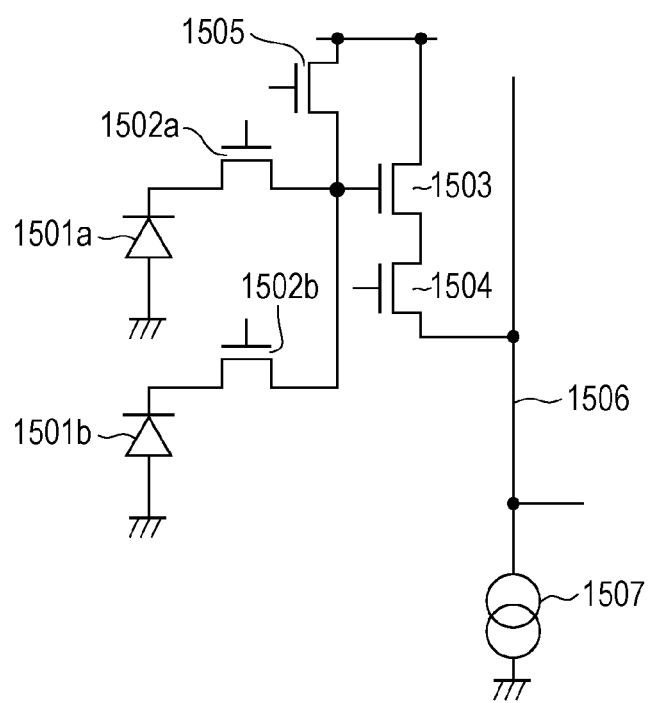

Next, FIGS. 14A and 14B illustrate examples of the equivalent circuit of the photoelectric conversion unit. FIG. 14A illustrates an example in which transistors having different functions are provided for each photoelectric conversion element. FIG. 14B illustrates an example in which transistors having different functions are provided for a plurality of photoelectric conversion elements in common.

Charge generated in photoelectric conversion elements 1401a and 1401b is transferred to input nodes of amplification transistors 1403a and 1403b by transfer transistors 1402a and 1402b, respectively. The input nodes of the amplification transistors 1403a and 1403b may be configured by gates of the amplification transistors 1403a and 1403b and a floating diffusion region electrically connected to the gates of the amplification transistors 1403a and 1403b. When pulses for turning on selection transistors 1404a and 1404b have been supplied to gates of the selection transistors 1404a and 1404b, signals according to the input nodes of the amplification transistors 1403a and 1403b are output to a vertical output line 1406. Thereafter, reset transistors 1405a and 1405b set the voltage of the input nodes of the amplification transistors 1403a and 1403b to a certain voltage. In such a circuit configuration, by exclusively turning on the selection transistors 1404a and 1404b, signals of the photoelectric conversion elements 1401a and 1401b are read to a column circuit and processes such as addition are performed, in order to realize capture of an image and focus detection.

Next, FIG. 14B will be described. A basic operation is the same as in FIG. 14A. Charge generated in photoelectric conversion elements 1501a and 1501b are transferred to an input node of an amplification transistor 1503 by transfer transistors 1502a and 1502b, respectively. The input node of the amplification transistor 1503 may be configured by a gate of the amplification transistor 1503 and a floating diffusion region electrically connected to the gate of the amplification transistor 1503. When a pulse for turning on a selection transistor 1504 has been supplied to a gate of the selection transistor 1504, a signal according to the input node of the amplification transistor 1503 is output to a vertical output line 1506. Thereafter, a reset transistor 1505 sets the voltage of the input node of the amplification transistor 1503 to a certain voltage. In FIG. 14B, since the amplification transistor 1503 is shared by the plurality of photoelectric conversion elements 1501a and 1501b, the input node of the amplification transistor 1503 may perform addition. Therefore, added signals may be output to the vertical output line 1506 from the photoelectric conversion unit.

Specific embodiments will be described hereinafter. A term "impurity concentration" used herein, in the claims, and in the drawings refers to net impurity concentration compensated by impurities of an opposite conductivity type. That is, it refers to so-called "net concentration". A region in which the concentration of added p-type impurities is higher than the concentration of added n-type impurities is a p-type semiconductor region. On the other hand, a region in which the concentration of added n-type impurities is higher than the concentration of added p-type impurities is an n-type semiconductor region.

First Embodiment

Figure 2:
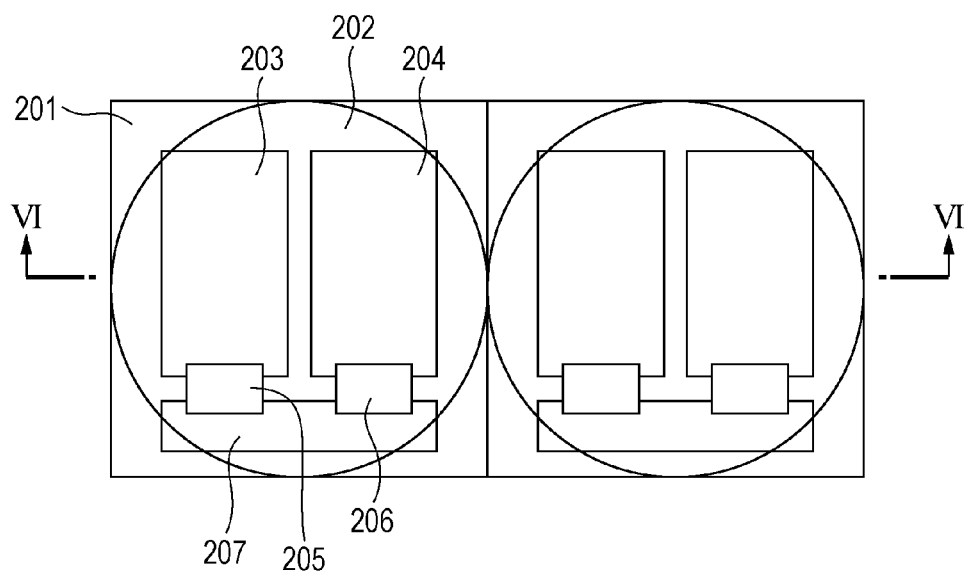
FIG. 2 is a diagram illustrating the schematic configuration of pixels in the image pickup apparatus according to a first embodiment.

FIG. 2 is a schematic diagram illustrating upper surfaces of photoelectric conversion units 201 of an image pickup apparatus 100 according to the present embodiment. A microlens 202 is provided for each photoelectric conversion unit 201. In addition, each photoelectric conversion unit 201 includes a plurality of photoelectric conversion elements. In FIG. 2, each photoelectric conversion unit 201 includes two PDs, namely a left PD 203 and a right PD 204, but the number of PDs may be two or more. For example, four PDs or nine PDs may be included. Transfer gates 205 and 206 transfer charge generated in the PD 203 and the PD 204, respectively, to a floating diffusion region 207. Although the floating diffusion region 207 is shared by the two PDs 203 and 204 in FIG. 2, a floating diffusion region may be provided for each PD, instead. Although the two photoelectric conversion units 201 are illustrated in FIG. 2, a larger number of photoelectric conversion units may be provided, instead.

Figure 3A:
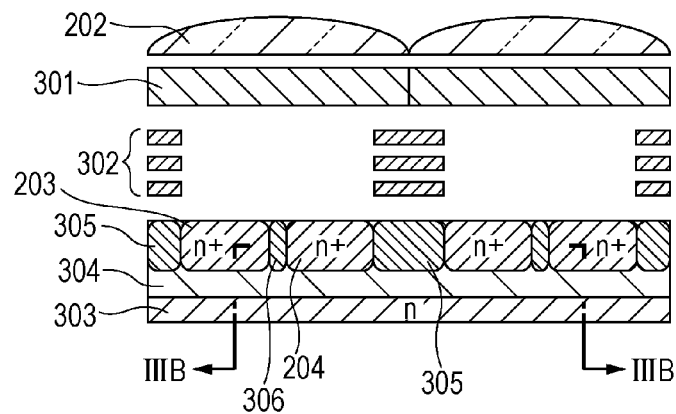
FIGS. 3A to 3D are diagrams schematically illustrating the cross-sectional structures and the minimum potentials of the pixels in the image pickup apparatus according to the first embodiment.
Figure 3B:
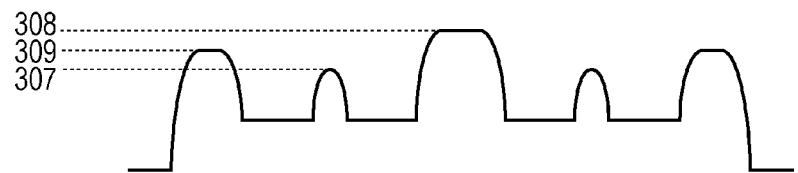

FIG. 3A is a diagram illustrating the cross-sectional structure of photoelectric conversion units according to the present embodiment, and FIG. 3B is a diagram schematically illustrating the potential of semiconductor regions taken along a broken line IIIB-IIIB illustrated in FIG. 3A relative signal carriers. FIGS. 3A and 3B are diagrams illustrating a case in which the OFD region is an n-type semiconductor substrate, and a so-called "OFD region in a vertical direction" (a vertical OFD (VOFD) region) will be described with reference to FIGS. 3A and 3B.

Figure 3C:
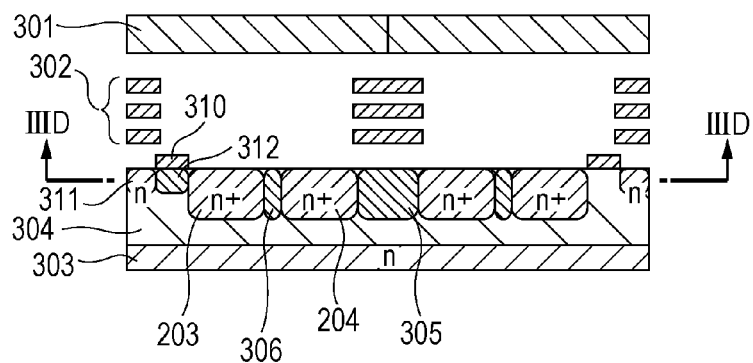
Figure 3D:
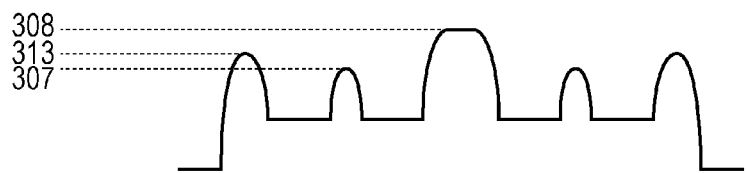

FIG. 3C is a diagram illustrating the cross-sectional structure of photoelectric conversion units according to the present embodiment, and FIG. 3D is a diagram schematically illustrating the potential of semiconductor regions taken along a broken line IIID-IIID illustrated in FIG. 3C relative to signal carriers. FIGS. 3C and 3D are diagrams illustrating a case in which the OFD region is an n-type floating diffusion region, a source region or a drain region of an n-type pixel transistor, or the like. A so-called "OFD region in a lateral direction" (a lateral OFD (LOFD) region) will be described with reference to FIGS. 3C and 3D. The image pickup apparatus 100 according to the present embodiment may have the cross-sectional structures illustrated in FIGS. 3A and 3C, or may have one of these cross-sectional structures.

First, the case of the VOFD region will be described. Color filters 301 are included. Wires 302 drive transistors in pixels and supplies power supply voltage and the like. A p-type semiconductor region 304 is provided on an n-type semiconductor substrate 303. N-type semiconductor regions 203 and 204 are provided in such a way as to configure p-n junctions with the p-type semiconductor region 304. The n-type semiconductor regions 203 and 204 are regions in which the potential is low relative to electrons, which are signal carriers, and the signal carriers may be collected.

A combination between the p-type semiconductor region 304 and the n-type semiconductor region 203 and a combination between the p-type semiconductor region 304 and the n-type semiconductor region 204 each form a PD. A left PD is a PD 203, and a right PD is a PD 204.

A p-type semiconductor region 305 is included in the adjacent photoelectric conversion units and provided between adjacent two PDs. A p-type semiconductor region 306 is provided between the PD 203 and the PD 204. The p-type semiconductor regions 305 and 306 may function as potential barriers for signal carriers.

In the present embodiment, a relationship between the heights of the potential barriers of the p-type semiconductor region 304 and the p-type semiconductor region 306 is defined. More specifically, the p-type impurity concentration of the p-type semiconductor region 306 is made lower than the p-type impurity concentration of the p-type semiconductor region 304. That is, a height 307 of the potential barrier generated by the p-type semiconductor region 306 is made smaller than a height 309 of the potential barrier generated by the p-type semiconductor region 304. In doing so, when one of the PDs has been saturated, charge leaks into the adjacent PD in the same photoelectric conversion unit before the charge leaks into the VOFD region.

More preferably, a height 308 of the potential barrier generated by the p-type semiconductor region 305 is made larger than the height 307 of the potential barrier generated by the p-type semiconductor region 306. Even more preferably, the height 308 of the potential barrier generated by the p-type semiconductor region 305 is made larger than the height 309 of the potential barrier generated by the p-type semiconductor region 304.

By using such structure, even if one of the PDs has been saturated due to a difference in sensitivity between the PD 203 and the PD 204 or a difference in luminance between lays of light incident on the PD 203 and the PD 204, respectively, a combined difference in sensitivity may be reduced.

As an example of preferable impurity concentration, the impurity concentration of the p-type semiconductor region 304 is at least three times higher than the impurity concentration of the p-type semiconductor region 306. More preferably, the impurity concentration of the p-type semiconductor region 304 is at least ten times higher than the impurity concentration of the p-type semiconductor region 306. It is to be noted that the reason why a difference of at least three times higher is used is that, on the basis of the potential of charge (about 26 mV at a room temperature of 27° C.), a difference between the potential barriers to the same degree is supposed to be formed.

Furthermore, in addition to the above condition of impurity concentration, the impurity concentration of the p-type semiconductor region 305 may be higher than the impurity concentration of the p-type semiconductor region 304. Furthermore, the impurity concentration of the p-type semiconductor region 305 is preferably at least three times higher than the impurity concentration of the p-type semiconductor region 306. More preferably, the impurity concentration of the p-type semiconductor region 305 is at least ten times higher than the impurity concentration of the p-type semiconductor region 306. It is to be noted that the reason why a difference of at least three times higher is used is that, on the basis of the potential of charge (about 26 mV at a room temperature of 27° C.), a difference between the potential barriers to the same degree is supposed to be formed.

Figure 5A:
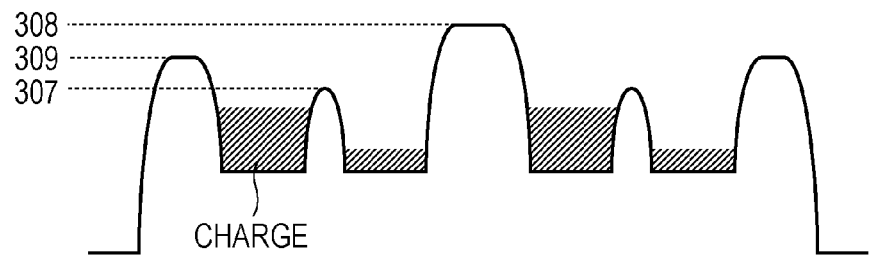
FIGS. 5A to 5D are diagrams schematically illustrating the minimum potential of the image pickup apparatus according to the first embodiment.
Figure 5B:
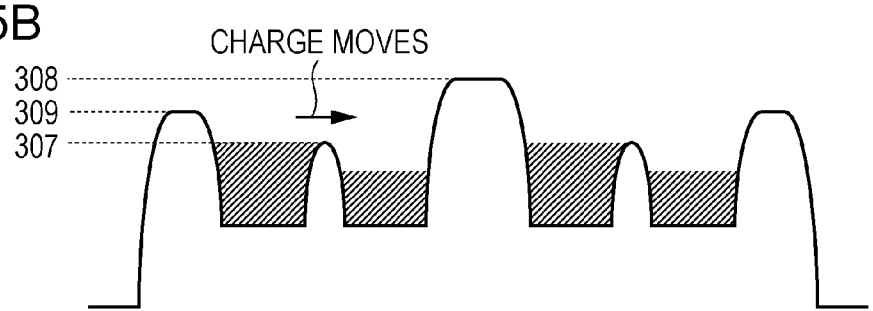

The PDs and the combined output will be described with reference to FIGS. 4 and 5A to 5D. FIG. 4 illustrates a combined input/output characteristic at a time when the input/output characteristics of the two PDs 203 and 204 and the outputs of the PDs 203 and 204 are combined. FIGS. 5A to 5D are diagrams schematically illustrating potential structure illustrated in FIG. 3B and generated charge. When light is incident on a PD, the PD performs photoelectric conversion, and electron-hole pairs are generated. For the sake of explanation, FIG. 4 illustrates a situation in which the PD 203 has higher sensitivity than the PD 204 or the amount of light incident on the PD 203 is larger than that incident on the PD 204. When the amount of light incident on the PDs 203 and 204 is within a range 401 illustrated in FIG. 4, the amount of charge generated is larger in the PD 203 than in the PD 204. This condition is illustrated in FIG. 5A. A combined output of the PD 203 and the PD 204 is indicating an appropriate value. Next, a situation in which the PD 203 has been saturated and the PD 204 has not been saturated occurs in a range 402. At this time, as illustrated in FIG. 5B, charge generated in the PD 203 may exceed the potential barrier 307 and move to the PD 204. Therefore, in the range 402, the output of the PD 204 is an amount of charge obtained by combining the charge generated in the PD 204 and the charge generated in the PD 203. Thus, by making the potential barrier 307 lower than the potential barrier 309, most of the charge generated in the PD 203 may leak into the PD 204 in the same photoelectric conversion unit. More preferably, as illustrated in FIG. 5B, the height of the potential barrier 308 is made larger than the height of the power supply unit 307.

Figure 5C:
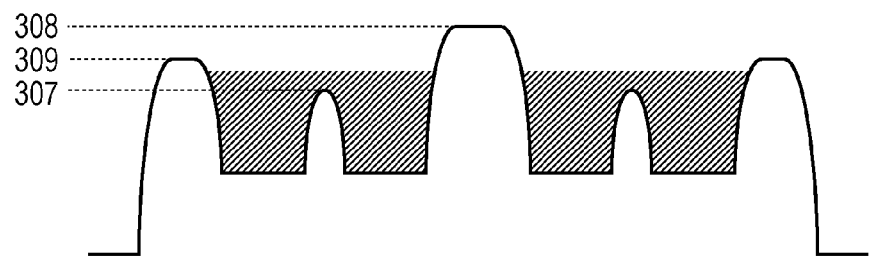
Figure 5D:
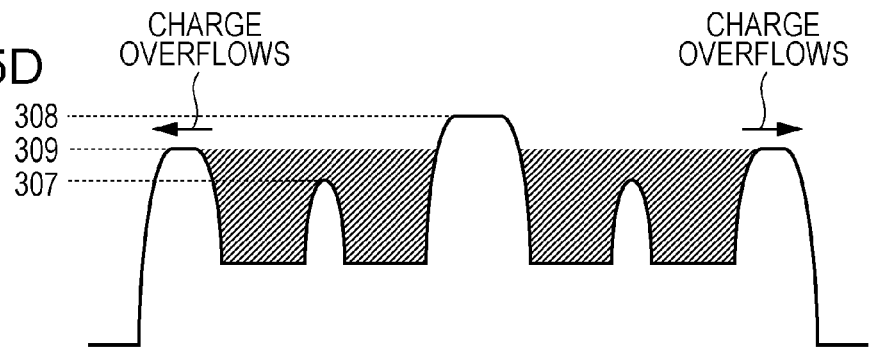

By making the potential barrier 307 lower than the potential barrier 309, in the range 402, too, the combined output of the PD 203 and the PD 204 may be close to an appropriate output as in the range 401. In a range 403, as illustrated in FIG. 5C, both the PDs 203 and 204 exceed a saturation level defined by the potential barrier 307, and the outputs of the PDs 203 and 204 increase up to a saturation level defined by the potential barrier 308 or the potential barrier 309, whichever is lower. In FIGS. 3A to 3D or FIGS. 5A to 5D, since the potential barrier 309 is lower than the potential barrier 308, the saturation level is defined by the potential barrier 309. In a range 404, as illustrated in FIG. 5D, since the outputs of both the PDs 203 and 204 have increased up to the saturation level defined by the potential barrier 309, the combined output is also saturated.

In the above ranges, by making the height of the potential barrier 307 smaller than the height of the potential barrier 309, the charge generated in the PD 203 may leak into the PD 204 in the same photoelectric conversion unit. Although the height of the potential barrier 308 is made larger than the height of the potential barrier 309 in the above description, a relationship between the potential barriers 308 and 309 may be opposite. When the height of the potential barrier 308 has been made larger than the height of the potential barrier 309, the saturation level of the PDs 203 and 204 is determined by the potential barrier 308, and overflowing charge is discharged into the semiconductor substrate 303. Thus, a phenomenon in which the overflowing charge leaks into another PD and becomes an alias may be suppressed. In addition, when the height of the potential barrier 309 has been made larger than the height of the potential barrier 308, the saturation level of the PDs 203 and 204 may be higher. In addition, the heights of the potential barriers 308 and 309 may be the same, or the height of the potential barrier 308 may be slightly smaller than the height of the potential barrier 309.

Next, a case in which the OFD region is an LOFD region will be described with reference to FIGS. 3C and 3D. An example in which a floating diffusion region is used as the LOFD region will be described.

A p-type semiconductor region 312 is provided between a floating diffusion region 311 and a PD 203. A p-type semiconductor region 312 may function as a potential barrier for signal carriers. A transfer gate 310 transfers electrons of electron-hole pairs generated in the PD 203 to the floating diffusion region 311. The height of a potential barrier 307 generated by the p-type semiconductor region 306 is made lower than the height of a potential barrier 313 generated by the p-type semiconductor region 312.

As illustrated in FIG. 3D, the height of the potential barrier 307 is smaller than the height of the potential barrier 313. By using such structure, even if either the PD 203 or a PD 204 has been saturated due to a difference in sensitivity between the PDs 203 and 204 or a difference in luminance between lays of light incident on the PDs 203 and 204, respectively, combined sensitivity may be close to constant. Furthermore, the height of the potential barrier 307 may be smaller than the height of the potential barrier 308.

As an example of preferable impurity concentration, the impurity concentration of the p-type semiconductor region 312 that configures the potential barrier 313 is at least three times higher than the impurity concentration of the p-type semiconductor region 306 that configures the potential barrier 307. More preferably, the impurity concentration of the p-type semiconductor region 312 is at least ten times higher than the impurity concentration of the p-type semiconductor region 306. It is to be noted that the reason why a difference of at least three times higher is used is that, on the basis of the potential of charge (about 26 mV at a room temperature of 27°

C.), a difference between the potential barriers to the same degree is supposed to be formed.

Furthermore, in addition to the above condition of impurity concentration, the impurity concentration of the p-type semiconductor region 305 may be higher than the impurity concentration of the p-type semiconductor region 312. Furthermore, the impurity concentration of the p-type semiconductor region 305 is preferably at least three times higher than the impurity concentration of the p-type semiconductor region 306. More preferably, the impurity concentration of the p-type semiconductor region 305 is at least ten times higher than the impurity concentration of the p-type semiconductor region 306. It is to be noted that the reason why a difference of at least three times higher is used is that, on the basis of the potential of charge (about 26 mV at a room temperature of 27° C.), a difference between the potential barriers to the same degree is supposed to be formed.

In the case of the LOFD region, too, the effects illustrated in FIGS. 4 and 5A to 5D may be obtained. In addition, it is sufficient if the LOFD region is provided in the lateral direction of an n-type semiconductor region that configures a PD, and the LOFD region may be a source region or a drain region of a transistor in the photoelectric conversion unit, or a dedicated LOFD region may be provided. The LOFD region is configured by an n-type semiconductor, and power supply voltage may be supplied to the LOFD region.

Either the VOFD region or the LOFD region may be used as a region into which the charge after saturation is discharged, but when the LOFD region is used, the impurity concentration may be accurately controlled because the LOFD region is generally arranged at a region close to a surface and therefore may be formed by ion implantation at a shallow level.

In addition, if a potential control gate is provided above a semiconductor region between an OFD region and an n-type semiconductor region that configures a PD, the conductivity type need not be particularly limited. This is because the height of the potential barrier of the semiconductor region between the OFD region and the n-type semiconductor region that configures the PD may be controlled by voltage supplied to the potential control gate.

Second Embodiment

Figure 6A:
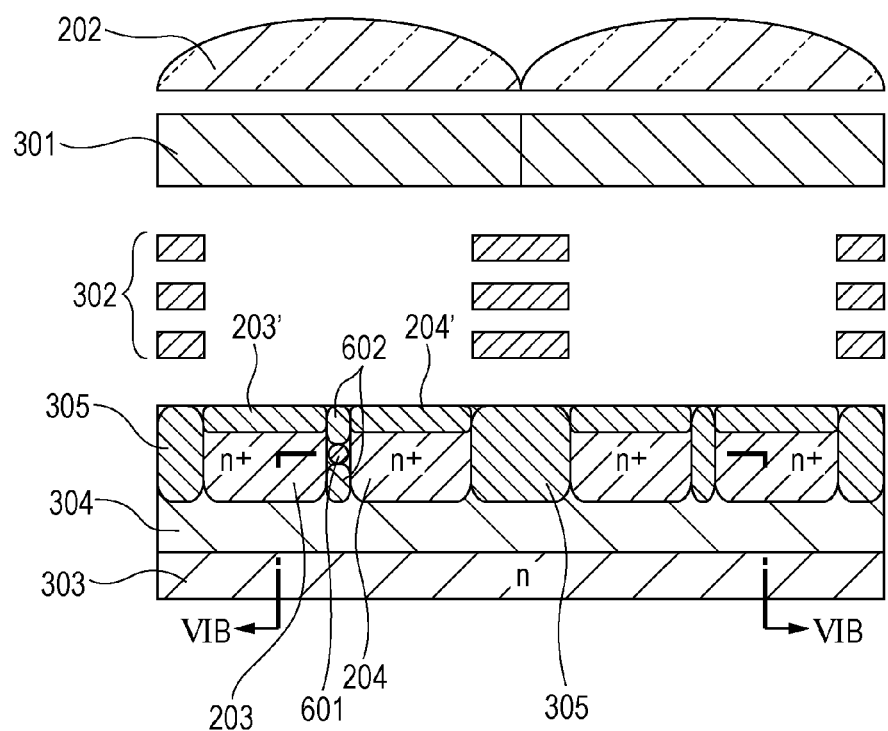
FIGS. 6A and 6B are diagrams schematically illustrating the cross-sectional structure and the minimum potential of pixels in the image pickup apparatus according to a second embodiment.
Figure 6B:
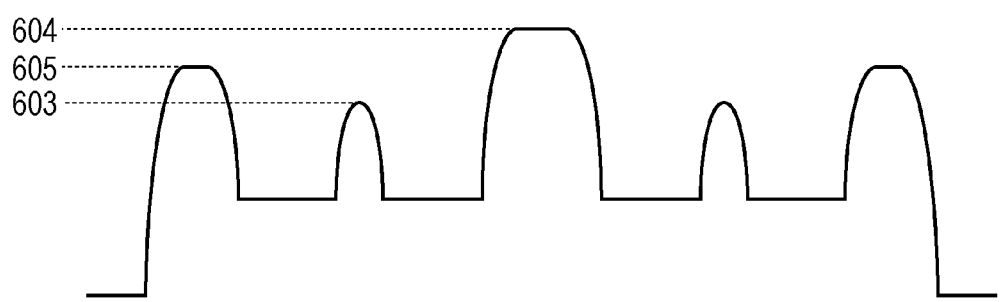

The present embodiment will be described with reference to the drawings. Components having the same functions as in the first embodiment are given the same reference numerals, and detailed description thereof is omitted. FIGS. 6A and 6B are diagrams illustrating the cross-sectional structure of photoelectric conversion units according to the present embodiment. FIG. 6A schematically illustrates the cross-sectional structure of a portion taken along a dash-dot line VI-VI illustrated in FIG. 2, and FIG. 6B schematically illustrates the minimum potential of a portion taken along a broken line VIB-VIB illustrated in FIG. 6A.

A difference from the first embodiment is that a p-type semiconductor region provided between photoelectric conversion elements included in a single photoelectric conversion unit is configured by a first part whose concentration is low and second parts whose concentrations are higher than the concentration of the first part. More specifically, the p-type semiconductor region provided between PDs on which light collected by a single microlens is incident is configured by a first part 601 whose concentration is low and second parts 602 whose concentrations are higher than the concentration of the first part 601.

FIG. 6B illustrates a potential barrier 603 generated by the first part 601. The height of the potential barrier 603 is lower than the height of a potential barrier 605 generated by a p-type semiconductor region 304. In addition, the height of the potential barrier 603 may be lower than the height of a potential barrier 604 generated by a p-type semiconductor region 305.

As an example of preferable impurity concentration, the impurity concentration of the p-type semiconductor region 304 is at least three times higher than the impurity concentration of the first part 601. More preferably, the impurity concentration of the p-type semiconductor region 304 is at least ten times higher than the impurity concentration of the first part 601.

It is to be noted that although only one first part 601 is provided in the present embodiment, a plurality of first parts 601 may be provided. In addition, with respect to depth, although a configuration is used in which the second parts 602, whose impurity concentrations are high, are provided on and under the first part 601, the first part 601 need not be sandwiched between the second parts 602 and may be provided on or under the second parts 602.

Here, compared to the second parts 602, the first part 601 is likely to be electrically connected to the PDs 203 and 204. When the PDs 203 and 204 have been completely connected to each other electrically, the height of the potential barrier 603 illustrated in FIG. 6B becomes smaller, and it becomes difficult to distinguish signals of the PD 203 and signals of the PD 204 during reading. That is, the accuracy of focus detection might decrease. In such a case, the first part 601 may be provided at a position whose depth from a surface of the substrate is different from the depths of portions 203' and 204' (hereinafter referred to as impurity concentration peak positions) of n-type semiconductor regions of the PDs 203 and 204, respectively, in which the n-type impurity concentrations are the highest. By making the depth of the first part 601 and the depths of the impurity concentration peak positions 203' and 204' different from each other, the independence of the signals of the PDs 203 and 204 may be certainly assured, and the heights of barriers of the PD 203 and the PD 204 may be smaller. Therefore, the knee characteristic may be suppressed and an output range in which independence is maintained may be increased.

Although a case of the VOFD region has been described in the present embodiment, the same holds true for a case of the LOFD region.

Third Embodiment

Figure 7:
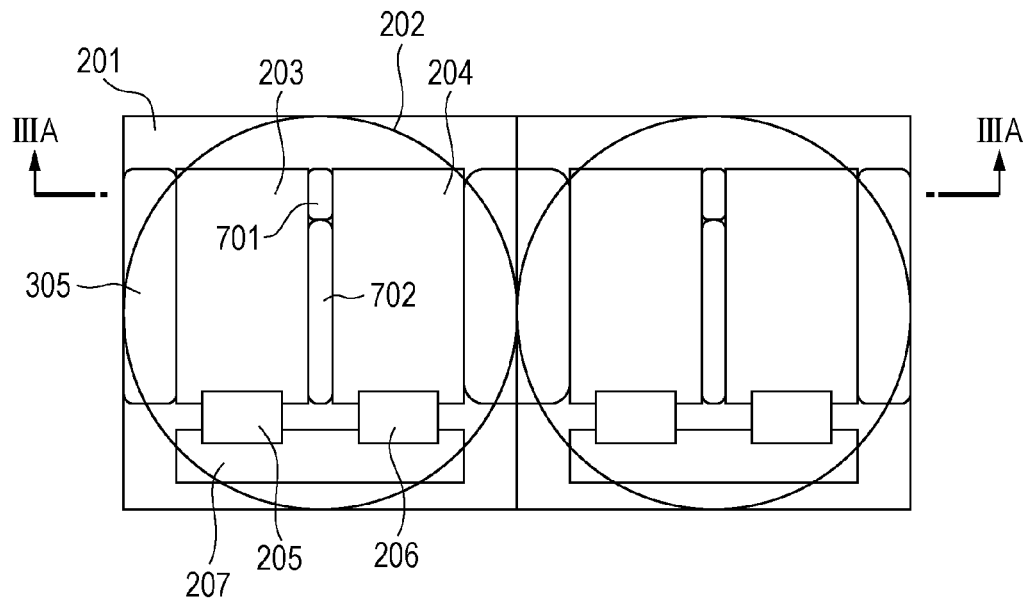
FIG. 7 is a diagram illustrating the image pickup apparatus according to a third embodiment viewed in plan.

A third embodiment will be described with reference to the drawings. FIG. 7 is a diagram illustrating the planar structure of pixels according to the present embodiment viewed from a light incident side. Components having the same functions as in the first and second embodiments are given the same reference numerals, and detailed description thereof is omitted. A difference of the present embodiment from the second embodiment is that a first part 701 and a second part 702 are provided at different positions between n-type semiconductor regions that configure adjacent PDs in the same photoelectric conversion unit when viewed in plan. With respect to other configurations, the same configurations as in the first and second embodiments may be used.

In FIG. 7, a p-type semiconductor region provided between photoelectric conversion elements PD1 and PD2 included in a single photoelectric conversion unit is configured by including the first part 701 and the second part 702 whose p-type impurity concentration is higher than that of the first part 701. In addition, when the OFD region is a VOFD region, the p-type impurity concentration of the first part 701 is lower than the p-type impurity concentration of a p-type semiconductor region 304. When the OFD region is an LOFD region, the p-type impurity concentration of the first part 701 is lower than the p-type impurity concentration of a p-type semiconductor region 312.

As illustrated in FIG. 7, p-type impurity concentration may be different at different positions in a plane. The cross-sectional structure of a portion taken along a broken line IIIA-IIIA illustrated in FIG. 7 is the same as the cross-sectional structure illustrated in FIG. 3A. In FIG. 7, unlike the structure illustrated in FIG. 6A, the impurity concentrations of isolation regions between the PDs are different not in a semiconductor substrate direction but in the plane.

Here, the state of the potential of the first part 701 is likely to change depending on the number of electrons existing in the PDs 203 and 204. Therefore, the probability of whether charge generated in the first part 701 moves to the PD 203 or the PD 204 varies between a state immediately after the beginning of accumulation in the PD 203 and the PD 204 and a state in which a larger amount of charge exists in one of the PDs 203 and 204, that is, for example, the PD 203. For example, when a larger amount of charge exists in the PD 203 immediately after the beginning of the accumulation, the potential of the first part 701 changes due to Coulomb interaction of the charge existing in the PD 203. Thereafter, the probability that the charge generated in the first part 701 moves to the PD 204 increases. That is, the probabilities that charge moves to the PD 203 and to the PD 204 change. In such structure, for example, feedback that cancels a difference in signals between the PDs 203 and 204 for detecting a difference in phase may be produced, thereby reducing the accuracy of the focus detection.

Such reduction in accuracy may be suppressed by adopting the following arrangement of the first part 701. More specifically, when the first part 701 is viewed in plan, the first part 701 is arranged at a position deviated from a projection position of a center position of each microlens onto light receiving surfaces of the photoelectric conversion elements. In FIG. 2, the projection positions are on a line that crosses substantially the centers of the microlenses, and the first part 701 is arranged in such a way as to be offset in an upper direction of the figure when viewed in plan. The essence of this arrangement is to isolate the first part 701 from regions around positions at which the intensity of light collected by each microlens is the highest. For example, in FIG. 7, the first part 701 is offset in the upper direction, but the direction of offset is not limited to this, and the direction may be a lower direction or, depending on the case, a left or right direction. As a preferable amount of offset, the first part 701 is arranged at a position 0.1 micrometer away from the center of the microlens. More preferably, the first part 701 is arranged at a position 0.2 micrometer away from the center of the microlens. This holds true for a case in which the range of wavelengths used by the PDs is a so-called visible light range. That is a case in which the wavelengths of visible light are about 0.4 to 0.8 micrometer and the focus of the microlens exists on the photoelectric conversion elements. In addition, because the light focus state of the photoelectric conversion elements also depends on the F value of an objective lens, a larger value may be used as the amount of offset at a time when a photoelectric conversion apparatus according to the present embodiment is applied to an optical system whose F value is small. For example, in the case of a system that may set the F value of the objective lens to 2.0, light having a maximum inclination of 14° relative to the perpendicular is incident on the microlens. When the distances between the microlenses and the PDs are 2 µm, the focal position of light incident at an inclination of 14° is offset, by 0.5 µm at least in one direction, from positions of the light receiving surfaces onto which the center position of the microlens is projected. In this case, it is particularly effective to arrange the first part 701 in such a way as to be offset from the center position of the microlens by 0.5 µm or more. In addition, the upper limit of the amount of offset is half the pitch of the adjacent photoelectric conversion elements.

An effect produced by the present embodiment in addition to the effects produced by the first and second embodiments is that the potential barriers may be adjusted using a layout pattern. Therefore, the degree of freedom in designing increases compared to a case in which the potential barriers are designed only by adjusting the depths of implantation of impurity ions in p-type semiconductor regions and the impurity concentrations. In addition, when the potential barriers are to be set in accordance with the first and second embodiments, a plurality of levels, namely the depths of implantation of impurity ions, concentrations, and heat treatment, need to be provided before the impurity ions are implanted in the p-type semiconductor regions. However, according to the present embodiment, a level may be provided in the layout pattern of a photomask used in a process for defining regions in which impurity ions are to be implanted. Therefore, by evaluating a single trial wafer, a layout pattern that may form appropriate potential barriers may be selected from a plurality of layout patterns.

Fourth Embodiment

A fourth embodiment will be described to the drawings. Components having the same functions as in the first to third embodiments are given the same reference numerals, and detailed description thereof is omitted. A difference of the present embodiment from the first to third embodiments is that a p-type semiconductor region provided between n-type semiconductor regions 203 and 204 includes a first part 801 and second parts 802 and the width of the first part 801 is smaller than the widths of the second parts 802.

Figure 8:
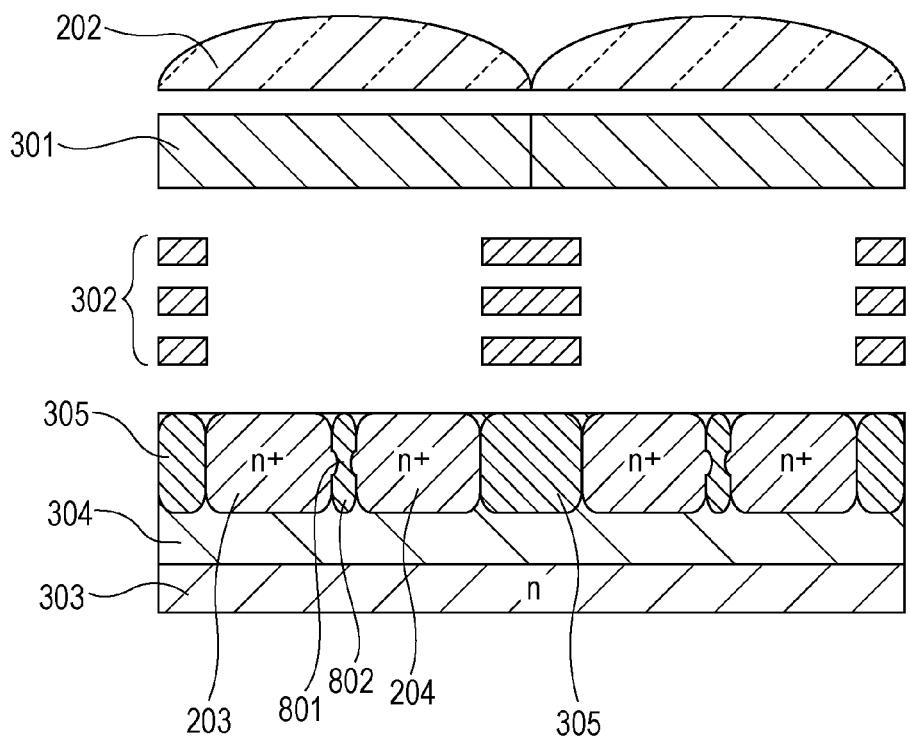
FIG. 8 is a diagram schematically illustrating the cross-sectional structure of pixels in the image pickup apparatus according to a fourth embodiment.

FIG. 8 is a diagram illustrating the cross-sectional structure of pixels according to the present embodiment. Although the first part 801 and the second parts 802 are provided at different depths in FIG. 8, the first part 801 and the second parts 802 may be provided at the same depth and different positions when viewed in plan as described in the third embodiment. In addition, the first part 801 may be configured by a plurality of portions that are isolated from one another.

In the above embodiments, a case in which potential barriers are configured by using n-type semiconductor regions that may accumulate signal carriers and p-type semiconductor regions of the opposite conductivity type has been described. However, insulator separation may be used in combination with this. Alternatively, a configuration may be used in which the height of a potential barrier between an OFD region and a PD region is controlled by using a control gate. In this case, the above-described relationship between the heights of the potential barriers needs to be satisfied while PDs are accumulating signal carriers.

Application to Focus Detection Apparatus

The photoelectric conversion apparatuses described in the above embodiments may be used as image pickup apparatuses and apparatuses that perform focus detection in image pickup surfaces. An example in which focus detection in an image pickup surface is performed using phase difference detection during capture of an image will be specifically described.

Figure 9:
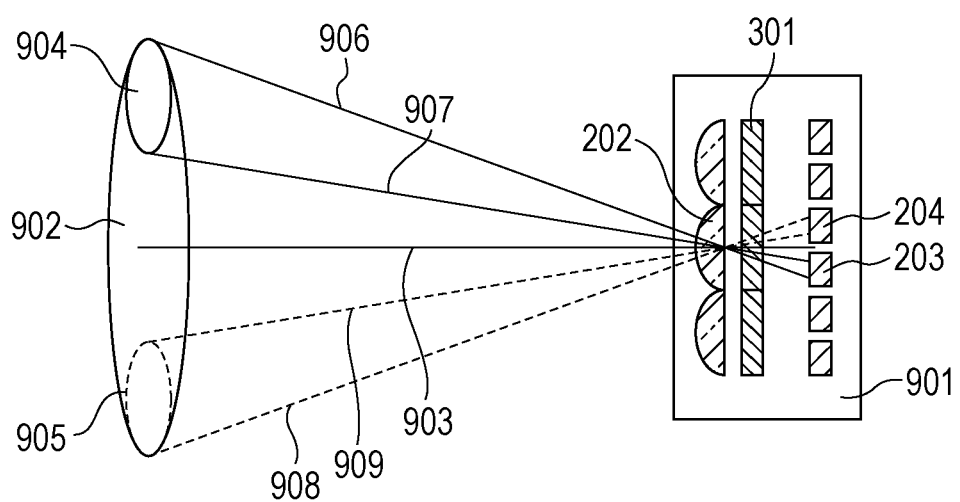
FIG. 9 is a diagram schematically illustrating the imaging relationship of an object.
Figure 10A:
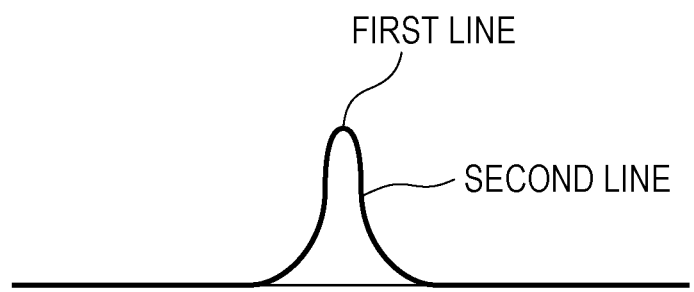
FIGS. 10A and 10B are diagrams schematically illustrating focus detection using a phase difference method.
Figure 10B:
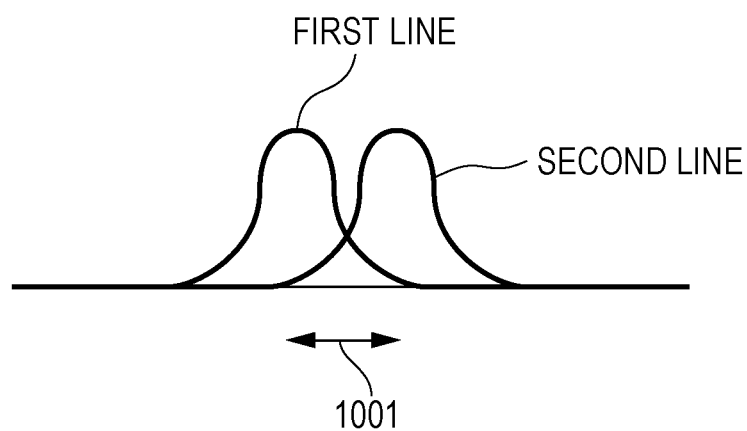

In the following description, FIGS. 9, 10A, and 10B will be referred to. FIG. 9 is a conceptual diagram illustrating a situation in which a light beam emitted from an exit pupil of an imaging lens is incident on an image pickup apparatus 901. Microlenses 202, color filters 301, and a plurality of photoelectric conversion elements PD1 and PD2 on which light collected by one of the microlenses 202 is incident are illustrated. An exit pupil 902 of the imaging lens is also illustrated. Here, the center of a light beam emitted from the exit pupil 902 to a photoelectric conversion unit including the microlenses 202 will be referred to an optical axis 903. The light emitted from the exit pupil 902 is incident on the image pickup apparatus 901 along the optical axis 903 as the center thereof. Light beams 906 and 907 are light beams along edges of light that passes through a certain region 904 of the exit pupil 902, and light beams 908 and 909 are light beams along edges of light that passes through a certain region 905 of the exit pupil 902. As may be seen from FIG. 9, among light beams emitted from the exit pupil 902, light beams above the optical axis 903 are incident on an upper PD, and light beams below the optical axis 903 are incident on a lower PD. That is, these PDs are receiving light beams from different regions of the exit pupil 902 of the imaging lens.

By utilizing this characteristic, detection of a phase difference is performed. When an image pickup region in a region within a pixel is viewed in plan, data obtained from one PD will be referred to as a first line, and data obtained from the other OD will be referred to as a second line in a plurality of photoelectric conversion elements on which light collected by a single microlens is incident. Thereafter, by obtaining correlation data between the lines, phases may be detected.

For example, in FIG. 9, data obtained from the lower PD 203 will be referred to as the first line, and data obtained from the upper PD 204 will be referred to as the second line in the photoelectric conversion elements on which light collected by one of the microlenses 202 is incident. In this case, the photoelectric conversion element PD1 outputs data regarding one pixel from the first line data, and the photoelectric conversion element PD2 outputs data regarding one pixel from the second line data. FIGS. 10A and 10B illustrate line data at a time when an image is formed using a point-source light. FIG. 10A illustrates first line data and second line data at a time when the image is in focus. The horizontal axis represents the positions of the pixels, and the vertical axis represents output. When the image is in focus, the first line and the second line overlap. FIG. 10B illustrates line data at a time when the image is out of focus. At this time, the first line and the second line have a phase difference, and the positions of the pixels are different. By calculating this amount of deviation 1001, how largely the image is out of focus may be identified. The image may be in focus by detecting the phases using such a method and by driving the lens.

Next, generation of image data in these pixel arrangements will be described. As described above, the focus may be detected by separately reading the signals of the photoelectric conversion elements PD1 and PD2 from the image pickup apparatus 901 and by performing calculation for detecting the phase difference. In addition, by adding the signals of the PDs 203 and 204 on which the light collected by one of the microlenses 202 is incident, a captured image may be generated.

However, in a state in which one of the PDs 203 and 204 has been saturated, that is, in a state illustrated in FIG. 5B, 5C, or 5D, the signals of the PDs 203 and 204 are different from the outputs separately obtained by the PDs 203 and 204. Therefore, the signals of the PDs 203 and 204 might be judged to have low reliability. In such a case, a sequence in which the phase detection is not performed or the phase detection is stopped may be adopted. That is, the image pickup apparatus 901 may be operated while judging whether or not to perform the phase difference detection on an image plane of the image pickup apparatus 901 in accordance with the signals of the PDs 203 and 204 or charge that may be accumulated.

Although a pixel around the center of the image pickup apparatus 901 has been described with reference to FIG. 9, the accuracy may be further improved when a pixel for focus detection is provided not at the center of an image pickup region but at an edge of the image pickup region because the difference in the amount of incident light between PDs is larger in a pixel at a periphery of the image pickup apparatus 901.

Application to Image Pickup System

Figure 11:
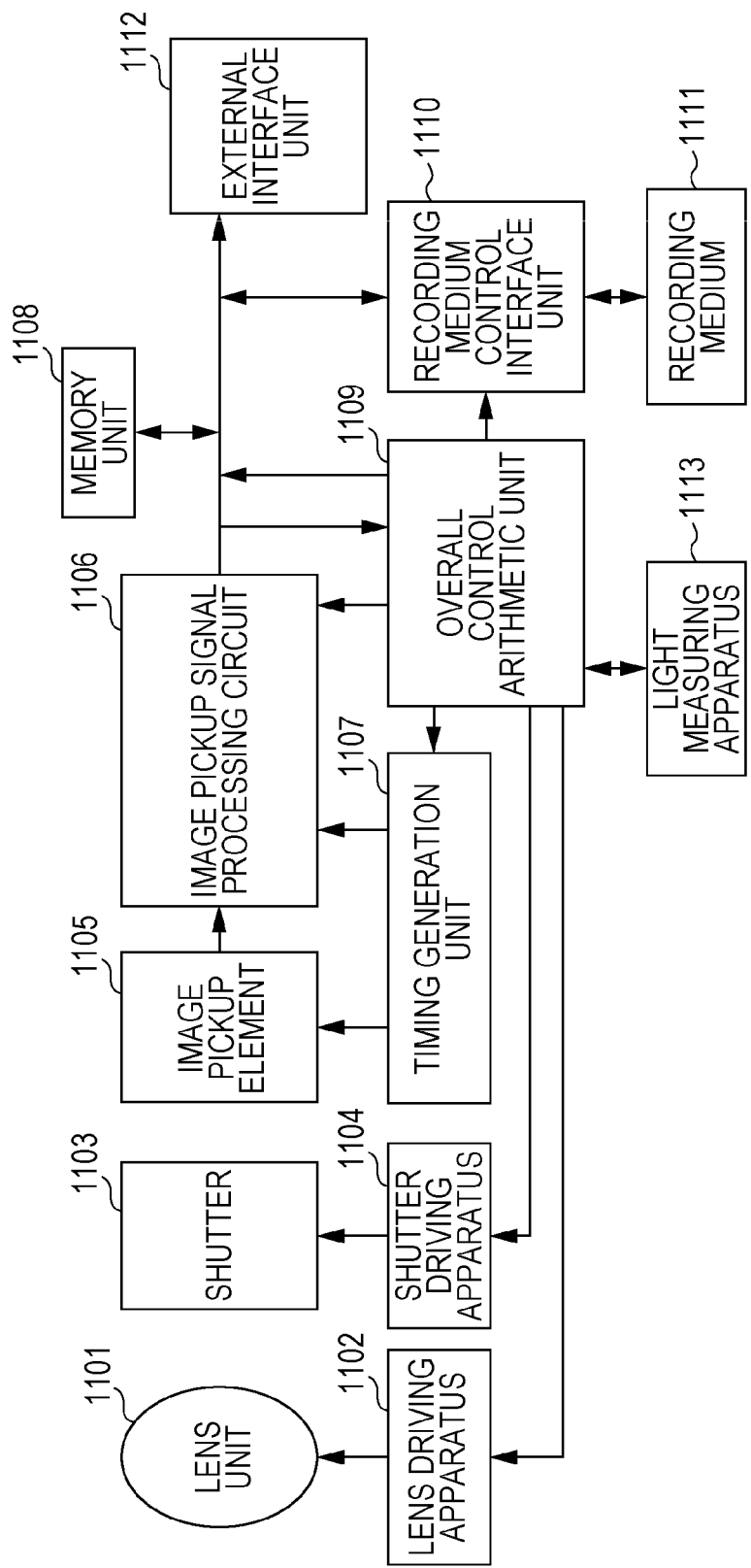
FIG. 11 is a diagram illustrating the outline of an image pickup apparatus.

FIG. 11 illustrates an example of an image pickup system to which the image pickup apparatus according to each of the above embodiments may be applied. In FIG. 11, a lens unit 1101 forms an optical image of a subject onto an image pickup element 1105, and a lens driving apparatus 1102 performs zoom control, focus control, aperture control, and the like. A shutter 1103 is controlled by a shutter driving apparatus 1104. The image pickup element 1105 obtains the image of the subject formed by the lens unit 1101 as an image signal, and an image pickup signal processing circuit 1106 performs various types of correction on the image signal output from the image pickup element 1105 and compresses data. A timing generation unit 1107 is driving means that outputs various timing signals to the image pickup element 1105 and the image pickup signal processing circuit 1106. An overall control arithmetic unit 1109 performs various types of calculation and controls the entirety of an image pickup apparatus, a memory unit 1108 temporarily stores image data, and a recording medium control interface unit 1110 records image data on or reads image data from a recording medium. A recording medium 1111 is a removable recording medium such as a semiconductor memory on which image data is recorded or from which image data is read, and an external interface unit 1112 is an external interface.

Next, the operation of a digital camera when an image is captured using the above configuration will be described. When a main power supply has been turned on, the power of a control system is turned on, and the power of an image pickup circuit such as the image pickup signal processing circuit 1106 is also turned on.

When a release button (not illustrated) has been pressed, ranging calculation is performed on the basis of data from the image pickup element 1105 and the overall control arithmetic unit 1109 performs calculation of a distance to the subject on the basis of a result of the ranging calculation. Thereafter, the lens driving apparatus 1102 drives the lens unit 1101 to judge whether or not an image is in focus. Thus, the digital camera using the image pickup apparatus according to each of the present embodiments may perform a focusing operation at high speed while suppressing generation of a false color.

The embodiments may be applied to various types of photoelectric conversion elements, and it is especially effective in a configuration in which there is a difference in sensitivity or the amount of incident light between photoelectric conversion elements. For example, in the above embodiments, an example in which a pixel is used for focus detection of an objective lens has been described. However, a characteristic of the image pickup apparatus is to secure the linearity of an output at a time when reading in which signals of a plurality of photoelectric conversion elements are added is performed, and therefore an application other than the focus detection is possible. For example, the plurality of photoelectric conversion elements may be provided with two types of color filters whose pass bands are different from each other, instead. More specifically, R', G', and B' color filters whose pass bands are different from one another are provided for colors of R, G, and B, respectively. When these color filters have been separately read, signals of six colors may be obtained, thereby improving color reproducibility. On the other hand, when addition of PDs and an operation for obtaining signals of three colors, namely R+R', G+G', and B+B', have been performed, sensitivity may be increased, thereby improving the signal-to-noise (S/N) ratio. The embodiments may be applied to a configuration in which it is possible to switch between these two capture modes in the same image pickup apparatus.

In addition, although a configuration in which electrons are used as signal carriers has been described, holes may be used, instead. In this case, the opposite conductivity type is used as the conductivity type of each semiconductor region.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

What is claimed is:

1. A photoelectric conversion apparatus comprising:
    a plurality of photoelectric conversion units, each including a plurality of photoelectric conversion elements on which light condensed by a single microlens is incident,
    wherein each of the plurality of photoelectric conversion elements includes a first semiconductor region of a first conductivity type that collects signal carriers,
    wherein the first semiconductor regions included in photoelectric conversion elements that are included in each of the photoelectric conversion units and that are arranged adjacent to each other sandwich a second semiconductor region of a second conductivity type, and
    wherein an impurity concentration of the second semiconductor region is lower than an impurity concentration of a region between each of the first semiconductor regions and an overflow drain region of the first conductivity type.

2. The photoelectric conversion apparatus according to claim 1,
    wherein the region between each of the first semiconductor regions and the overflow drain region of the first conductivity type is a third semiconductor region of the second conductivity type.

3. The photoelectric conversion apparatus according to claim 2,
    wherein an impurity concentration of the third semiconductor region is at least three times higher than an impurity concentration of a certain region or portion of the second semiconductor region.

4. The photoelectric conversion apparatus according to claim 3,
    wherein the impurity concentration of the third semiconductor region is at least ten times higher than the impurity concentration of the certain region or portion of the second semiconductor region.

5. The photoelectric conversion apparatus according to claim 1,
    wherein each of the photoelectric conversion units includes a plurality of photoelectric conversion elements on which light collected by a single microlens is incident.

6. The photoelectric conversion apparatus according to claim 1,
    wherein the overflow drain region is a semiconductor region of the first conductivity type arranged in a vertical direction of the first semiconductor region.

7. The photoelectric conversion apparatus according to claim 6,
    wherein the semiconductor region of the first conductivity type is a semiconductor substrate of the first conductivity type.

8. The photoelectric conversion apparatus according to claim 1,
    wherein the overflow drain region is a semiconductor region of the first conductivity type arranged in a lateral direction of the first semiconductor region.

9. The photoelectric conversion apparatus according to claim 8,
    wherein the semiconductor region of the first conductivity type is a source region or a drain region of a transistor of the first conductivity type included in each of the photoelectric conversion units.

10. The photoelectric conversion apparatus according to claim 1,
    wherein the second semiconductor region includes a first part and a second part, and an impurity concentration of the first part is lower than an impurity concentration of the second part or a width of the first part when viewed in plan is smaller than a width of the second part when viewed in plan.

11. The photoelectric conversion apparatus according to claim 10,
    wherein the first part is arranged at a depth different from a depth at which the second part is arranged.

12. The photoelectric conversion apparatus according to claim 10,
    wherein a depth of an impurity concentration peak of the first part is different from a depth of an impurity concentration peak of the first semiconductor region.

13. The photoelectric conversion apparatus according to claim 1,
    wherein a fourth semiconductor region of the second conductivity type is provided between the first semiconductor regions included in adjacent photoelectric conversion elements included in different photoelectric conversion units arranged adjacent to each other, and a height of a potential barrier generated at least in a certain region of the second semiconductor region is smaller than a height of a potential barrier generated in the fourth semiconductor region.

14. The photoelectric conversion apparatus according to claim 13,
    wherein the height of the potential barrier generated in the fourth semiconductor region is larger than a height of a potential barrier generated in the third semiconductor region.

15. An image pickup system comprising:
    the photoelectric conversion apparatus according to claim 1,
    wherein capture of an image is performed using signals obtained by adding signals of the plurality of photoelectric conversion elements included in the plurality of photoelectric conversion units, and
    wherein focus detection during the capture of the image is performed using at least one of the signals of the plurality of photoelectric conversion elements included in the plurality of photoelectric conversion units.

16. The image pickup system according to claim 15,
    wherein the focus detection is stopped when an amount of charge that is accumulated by one or more photoelectric conversion elements in the plurality of photoelectric conversion units has been exceeded.

17. A photoelectric conversion apparatus comprising:
    a plurality of photoelectric conversion units, each including a plurality of photoelectric conversion elements on which light condensed by a single microlens is incident,
    wherein each of the plurality of photoelectric conversion elements includes a first semiconductor region of a first conductivity type that collects signal carriers, wherein the first semiconductor regions included in photoelectric conversion elements that are included in each of the photoelectric conversion units and that are arranged adjacent to each other sandwich a second semiconductor region of a second conductivity type, and wherein an impurity concentration of the second semiconductor region is lower than an impurity concentration of a region between each of the first semiconductor regions and a semiconductor substrate of the first conductivity type.

18. A photoelectric conversion apparatus comprising:

a plurality of photoelectric conversion units, each including a plurality of photoelectric conversion elements on which light condensed by a single microlens is incident, and a floating diffusion region of a first conductivity type that receives charge from the first semiconductor region, wherein each of the plurality of photoelectric conversion elements includes a first semiconductor region of a first conductivity type that collects signal carriers, wherein the first semiconductor regions included in photoelectric conversion elements that are included in each of the photoelectric conversion units and that are arranged adjacent to each other sandwich a second semiconductor region of a second conductivity type, and wherein an impurity concentration of the second semiconductor region is lower than an impurity concentration of a region between each of the first semiconductor regions and the floating diffusion region.

\* \* \* \* \*